United States Patent [19]

Miller

[11] 4,208,624
[45] Jun. 17, 1980

[54] METHOD AND APPARATUS FOR INVESTIGATING DIELECTRIC SEMICONDUCTOR MATERIALS

[75] Inventor: Gabriel L. Miller, Westfield, N.J.

[73] Assignee: Bell Telephone Laboratories, Incorporated, Murray Hill, N.J.

[21] Appl. No.: 932,373

[22] Filed: Aug. 9, 1978

[51] Int. Cl.² ............... G01R 31/22; G01R 27/26
[52] U.S. Cl. ................. 324/60 R; 324/60 C; 324/158 D; 324/158 R
[58] Field of Search .......... 324/60 C, 60 R, 158 D, 324/158 R, 61 R; 29/574

[56] References Cited

U.S. PATENT DOCUMENTS

| 3,315,156 | 4/1967 | Keller | 324/60 R |
| 3,605,015 | 9/1971 | Copeland | 324/158 D |

OTHER PUBLICATIONS

Milnes, A. G., Deep Impurities in Semiconductors, John Wiley & Sons, 1973; p. 215.
Abragam, A., The Principles of Nuclear Magnetism, Oxford Univ. Press, 1961; p. 77.
IEEE Trans. on Electron Devices, Ed.-22, 1975, p. 1055.
Robinson et al., "Nuclear Resonance Absorption Circuit," J. of Sci. Instruments, vol. 36, Dec. 1959, pp. 481-487.
Losee, D. L., "Admittance Spectroscopy . . . ", Appl. Phys. Lett., vol. 21, No. 2, Jul. 15, 1972, pp. 54-56.
Petroff et al., "A New Spectroscopic . . . ", Appl. Phys. Lett., vol. 31, No. 2; Jul. 15, 1977, pp. 60-62.
Miller et al., "Capacitor Transient Spectroscopy", Ann. Rev. Mater. Sci., 1977, pp. 377-448.

Primary Examiner—Rudolph V. Rolinec
Assistant Examiner—Ernest F. Karlsen
Attorney, Agent, or Firm—Peter A. Businger

[57] ABSTRACT

A method and apparatus are disclosed for determining electrical properties of dielectric and semiconducting materials and devices by admittance measurement. According to the disclosed method, a sample contained between electrodes is subjected to an essentially sinusoidal radio frequency signal. Simultaneously, the sample is subjected to a perturbation as may be produced, e.g., by thermal, optical, or electron irradiation. Admittance is determined as a current-to-voltage ratio.

According to the invention, signal-to-noise ratio in the output signal is enhanced by establishing a resonant circuit formed by the sample capacitor and an appropriately selected inductor element and pulsing the perturbation synchronous to the resulting resonant oscillation.

10 Claims, 2 Drawing Figures

METHOD AND APPARATUS FOR INVESTIGATING DIELECTRIC SEMICONDUCTOR MATERIALS

TECHNICAL FIELD

The invention is concerned with the determination of electrical properties of dielectric and semiconductor materials.

BACKGROUND OF THE INVENTION

The selection of semiconductor materials in the manufacture of semiconductor devices typically involves consideration of material properties such as, e.g., conductivity, dopant concentration and distribution, dopant activation energy, trap concentrations and distributions, trap depths, and trap cross sections. While experimental determination of such properties is particularly important at the design and development stage of devices, similar measurements may be of interest at various stages of a manufacturing process, e.g., upon implantation or diffusion of dopants.

Prominent among methods for determining electrical properties of matter are methods which involve capacitance measurement upon application of an electrical signal. For example, U.S. Pat. No. 3,315,156 discloses a method for determining resistance of a disc of pure semiconductor material by an arrangement in which a semiconductor sample is placed between electrodes. A radiofrequency signal is applied and distance between electrodes is adjusted until resonance is realized in the circuit.

While capacitance methods are applicable most directly to the measurement of dielectric properties of high-resistivity materials, they can be adapted to the measurement of properties of doped semiconductor materials by using a reverse biased p-n junction structure as disclosed in the book by A. G. Milnes, "*Deep Impurities in Semiconductors*", Wiley, 1973, p. 215. By employing doped semiconductor materials in this fashion, conductivity is reduced to a level at which capacitance measurement is practicable, e.g., by means of a radio frequency bridge as disclosed in the paper by G. L. Miller et al., "Capacitance Transient Spectroscopy", *Ann. Rev. Mater. Sci.* 1977, pages 377–448.

The determination of certain semiconductor properties such as, e.g., impurity concentrations is facilitated by capacitance measurement as a function of sample temperature. Such a technique is disclosed in the paper by D. L. Loose, "Admittance Spectroscopy of Deep Impurity Levels: ZnTe Schottky Barriers", *Applied Physics Letters* Vol. 21, No. 2, 15 July 1972, pages 54–56, where admittance data as a function of frequency and temperature are used to gain information regarding types and concentrations of deep impurity levels.

Dielectric properties of a material may be determined by measuring current flow induced either by a sinusoidal voltage or else by a voltage pulse. These regimes are known as steady state and transient measuring systems, respectively. Moreover, in order to gain full spatial information about defects, the properties of a sample can be monitored as a function of a localized perturbation such as produced, e.g., by a scanning electron or laser beam. This approach is described in the paper by P. M. Petroff et al., "A New Spectroscopic Technique for Imaging the Spatial Distribution of Non-Radiative Defects in a Scanning Transmission Electron Microscope", *Applied Physics, Letters*, Vol. 31, No. 2, 15 July 1977, pages 60–62.

Attendant primarily to scanning beam imaging methods is a concern with the magnitude of the signal produced when only a relatively small portion of a semiconductor sample is perturbed at any one time. Specifically, in the interest of image resolution, a small spot size is desirable, but, in the interest of adequate signal-to-noise ratio, a certain minimal spot size is required to produce a meaningful signal. This concern motivates the search for imaging methods having enhanced signal-to-noise ratio.

SUMMARY OF THE INVENTION

The invention provides for enhanced signal-to-noise ratio in admittance spectroscopy of dielectric and semiconductor materials and in investigating the properties of semiconductor surfaces and interfaces. In an electric test circuit comprising a sinusoidal voltage or current generator, a sample disposed between electrodes, a modulated perturbing source, and an inductor element, a resonant oscillation is established. If generator frequency, sample capacitance, inductance of the inductor element and perturbation modulation frequency are properly related, enhanced signal-to-noise ratio is realized in the resulting dielectric or semiconductor measurement.

DETAILED DESCRIPTION

Figure 1:
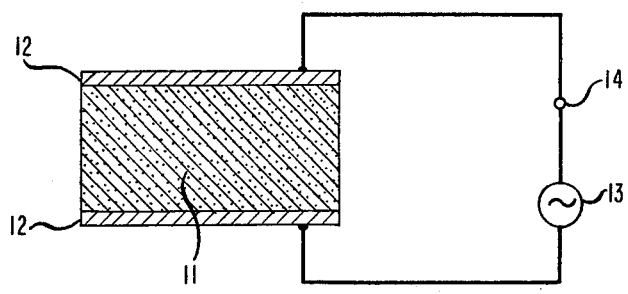
FIG. 1 schematically shows a prior art circuit for capacitance measurement of a dielectric or semiconductor sample.

FIG. 1 shows semiconductor sample 11 between electrodes 12 to which a voltage signal is applied by oscillator 13. Current strength is sensed at output terminal 14.

Figure 2:
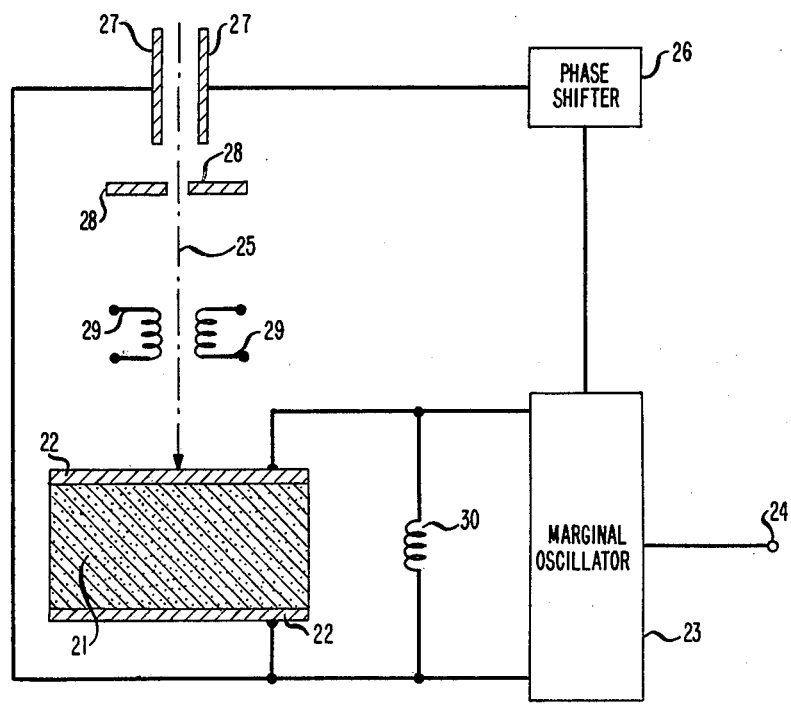
FIG. 2 schematically shows a circuit for measuring capacitance of a dielectric or semiconductor sample according to the invention.

FIG. 2 shows semiconductor sample 21 between electrodes 22 which are connected to radio frequency oscillator 23. Oscillator 23 is designed to produce a sinusoidal voltage signal between electrodes 22 and has an output terminal 24 at which current strength can be sensed, e.g., by means of a radio frequency rectifier and filter. Oscillator 23 also produces a trigger signal for controlling electron beam 25 and is connected via adjustable phase shift circuit 26 to chopping plates 27, which, in combination with chopping aperture 28, permits pulsing of the electron beam synchronous to the sinusoidal signal. Deflection coils 29 permit x-y-scanning of the sample surface, typically in a raster fashion and at a rate much slower than the frequency of the sinusoidal signal. The circuit formed by oscillator 23 and semiconductor sample 21 is augmented by inductor element 30 which is chosen to produce resonance in the circuit at an appropriate frequency.

Oscillator 23 is of a type well known in the art of electrical measurement where it is commonly designated a marginal oscillator. See e.g. page 77 of the book by A. Abragam, "The Principles of Nuclear Magnetism", Oxford University Press, 1961. Such oscillator maintains the circuit at a low level of oscillation and ensures that resonance is maintained even when sample capacitance changes, e.g., as induced by a change in temperature.

While the figure shows the use of an electron beam to locally perturb the semiconductor sample, alternate means are not precluded. For example, a scanning light beam may be used in an analogous fashion to produce a localized perturbation. Moreover, while enhancement of signal-to-noise ratio is of particular interest in connection with spatial imaging methods, the new technique may also be applied in combination with non-imaging methods such as temperature dependent admittance spectroscopy as disclosed in the paper by D. L. Loose cited above.

Phase shift 26 may serve, e.g., to delay the signal triggering the perturbing source by 90 degrees relative to the phase of the signal applied to sample 21. This technique allows the observation of local trapping in the semiconductor sample as follow: At sample locations at which local trapping is such that thermal detrapping time constant is approximately equal to the reciprocal of the oscillator frequency, a change in signal amplitude is observed. At locations where there is no local trapping, no change occurs.

Inductor element 30 is typically chosen to have an inductance which, in combination with the sample capacitance, results in resonance at some desired frequency. Thus, if sample capacitance is denoted by C and inductance of element 30 by L, then the resulting angular frequency is $(LC)^{-\frac{1}{2}}$. As a consequence, signal-to-noise ratio of the current signal is enhanced by a factor of $Q = R^{-1} (L/C)^{\frac{1}{2}}$, where R denotes the total series loss resistance of the resonant circuit. Similar considerations apply when an inductor element is connected in series with sample 1 rather than in parallel as shown in FIG. 2.

In the interest of enhanced signal-to-noise ratio, the sample perturbation is pulsed at the oscillator frequency. The choice of oscillator frequency is influenced by the type of material property to be investigated and, in particular, by the speed with which dielectric and semiconductor phenomena take place in a sample. Specifically, in order to realize the full benefit of signal-to-noise enhancement in the presence of 1/f noise, frequency is preferably chosen as high as possible subject to the requirement that the phenomenon to be observed be adequately realized. In general, frequencies in the range of 100 KHz to 10 MHz are suitable for investigating electrical properties of doped semiconductor materials such as, e.g., Si, Ge, and III–V compounds.

In addition to being applicable to the determination of deep level semiconductor properties, the disclosed method is equally applicable for the determination of surface and interface properties based on capacitance measurement. One such technique is disclosed in the report by T. H. DiStefano, "Scanned Surface Photovoltage Images of Defects on Semiconductors", *IEEE Trans. Elec. Dev.* Ed-22 (1975), page 1055.

EXAMPLE

A semiconductor sample was prepared for demonstrating enhanced signal-to-noise ratio in electron beam imaging according to the invention and as compared with a prior art method. The sample was obtained by proton damaging a portion of the surface of a silicon p-n junction with $10^{13}/cm^2$ protons at 1.5 MeV, while a complementary portion of the surface was shielded from irradiation. The resulting sample was investigated by prior art electron beam induced conductivity measurement by scanning with an electron beam having a beam current of $2 \times 10^{-12}$ A and feeding the resulting current signal to a current amplifier. Damaged and undamaged portions of the sample produced signals which were virtually indistinguishable due to the dominance of noise.

The same sample was then investigated by the new technique by using a 1 MHz resonating oscillator system as described and diagrammed in the paper by F. N. H. Robinson, "Nuclear Resonance Absorption Circuit", *Journal of Scientific Instruments*, Vol. 36, pages 481–487. Influence of noise was negligible and clearly distinguishable signals were obtained from damaged and undamaged portions of the sample.

I claim:

1. Method for determining electrical properties of at least a portion of a body of a dielectric or semiconductor material by measuring electrical admittance of a capacitor formed by two electrodes between which said body is disposed, said method comprising the steps of (1) applying an essentially sinusoidal electrical signal to said electrodes, (2) perturbing the electrical state of said portion in a pulsed fashion, and (3) determining admittance as the complex quotient of capacitor current and voltage CHARACTERIZED IN THAT (a) an inductor element is placed in parallel or in series with said capacitor, the inductance of said inductor element being selected to produce resonance at a desired frequency in the circuit formed by said capacitor and said inductor element and (b) perturbing the electrical state of said portion is synchronous to the phase of said signal whereby signal-to-noise ratio of said quotient is enhanced.

2. Method of claim 1 in which perturbing the electrical state of said portion is effected by an electron or light beam.

3. Method of claim 2 in which said beam is scanned across said body.

4. Method of claim 3 in which said beam is pulsed in phase with said signal.

5. Method of claim 3 in which said beam is pulsed 90 degrees out-of-phase relative to the phase of said signal.

6. Apparatus for determining electrical properties of at least a portion of a body of a dielectric of semiconducting material by measuring electrical admittance of a capacitor formed by two electrodes between which said body is disposed, admittance being determined as a function of a controlled perturbation of said portion and by forming the complex current-to-voltage quotient of current flowing between said electrodes and voltage between said electrodes in response to an essentially sinusoidal signal applied to said electrodes, said apparatus comprising (1) a generator of said signal, (2) contacts for applying said signal to said electrodes, (3) means for sensing said voltage and said current, and (4) means for producing a perturbation of said body CHARACTERIZED IN THAT said apparatus comprises (a) at least one circuit element having an inductance which is selected to produce resonance in the circuit formed by said capacitor and said element, and (b) means for pulsing said perturbation synchronous to the phase of said signal whereby signal-to-noise ratio of said quotient is enhanced.

7. Apparatus of claim 6 in which inductance of said inductor element is adjustable.

8. Apparatus of claim 6 in which said means for producing said perturbation is an electron or laser beam.

9. Apparatus of claim 8 comprising control means for causing said beam to scan across said body.

10. Apparatus of claim 6 in which said means for pulsing said perturbation comprises a variable phase shift.

* * * * *

UNITED STATES PATENT AND TRADEMARK OFFICE
CERTIFICATE OF CORRECTION

PATENT NO. : 4,208,624
DATED : June 17, 1980
INVENTOR(S) : Gabriel L. Miller

It is certified that error appears in the above—identified patent and that said Letters Patent are hereby corrected as shown below:

Column 4, line 39, "of" (third occurrence) should read --or--.

Signed and Sealed this

Thirtieth Day of September 1980

[SEAL]

Attest:

SIDNEY A. DIAMOND

Attesting Officer

Commissioner of Patents and Trademarks